(12) United States Patent
McKechnie et al.

(10) Patent No.: US 7,615,097 B2
(45) Date of Patent: Nov. 10, 2009

(54) NANO POWDERS, COMPONENTS AND COATINGS BY PLASMA TECHNIQUE

(75) Inventors: Timothy N. McKechnie, Brownsboro, AL (US); Leo V. M. Antony, Huntsville, AL (US); Scott O'Dell, Arab, AL (US); Chris Power, Guntersville, AL (US); Terry Tabor, Huntsville, AL (US)

(73) Assignee: Plasma Processes, Inc., Huntsville, AL (US)

(*) Notice: Subject to any disclaimer, the term of this patent is extended or adjusted under 35 U.S.C. 154(b) by 167 days.

(21) Appl. No.: 11/544,338

(22) Filed: Oct. 6, 2006

(65) Prior Publication Data
US 2008/0202288 A1    Aug. 28, 2008

Related U.S. Application Data

(60) Provisional application No. 60/726,386, filed on Oct. 13, 2005.

(51) Int. Cl.
*B22F 9/14* (2006.01)
(52) U.S. Cl. .......................................... 75/346; 75/367
(58) Field of Classification Search .................... 75/346
See application file for complete search history.

(56) References Cited

U.S. PATENT DOCUMENTS

| | | | |
|---|---|---|---|
| 4,610,857 A * | 9/1986 | Ogawa et al. ............... 423/335 |
| 4,812,166 A * | 3/1989 | Saiki et al. ..................... 75/346 |
| 5,573,682 A | 11/1996 | Beason et al. |
| 5,958,329 A | 9/1999 | Brown |
| 5,989,648 A | 11/1999 | Phillips |
| 6,428,596 B1 | 8/2002 | Urevich et al. |
| 6,580,051 B2 | 6/2003 | Peterson et al. |
| 6,689,192 B1 * | 2/2004 | Phillips et al. ................ 75/342 |
| 6,726,992 B1 | 4/2004 | Yadav et al. |
| 6,752,979 B1 | 6/2004 | Talbot et al. |
| 6,755,886 B2 | 6/2004 | Phillips et al. |
| 6,777,639 B2 | 8/2004 | Schroder et al. |
| 6,814,927 B2 | 11/2004 | Liao et al. |
| 6,852,304 B2 | 2/2005 | Yaginuma et al. |
| 2004/0009118 A1 * | 1/2004 | Phillips et al. ............ 423/592.1 |
| 2007/0029291 A1 * | 2/2007 | Boulos et al. ........... 219/121.59 |
| 2007/0075052 A1 * | 4/2007 | Fanson et al. .......... 219/121.52 |

* cited by examiner

*Primary Examiner*—George Wyszomierski
(74) *Attorney, Agent, or Firm*—Stephen H. Hall; Frank M. Caprio; Bradley Arant Boult Cummings LLP (57) ABSTRACT

Ultra fine and nanometer powders and a method of producing same are provided, preferably refractory metal and ceramic nanopowders. When certain precursors are injected into the plasma flame in a reactor chamber, the materials are heated, melted and vaporized and the chemical reaction is induced in the vapor phase. The vapor phase is quenched rapidly to solid phase to yield the ultra pure, ultra fine and nano product. With this technique, powders have been made 20 nanometers in size in a system capable of a bulk production rate of more than 10 lbs/hr. The process is particularly applicable to tungsten, molybdenum, rhenium, tungsten carbide, molybdenum carbide and other related materials.

13 Claims, 9 Drawing Sheets

NANO POWDERS, COMPONENTS AND COATINGS BY PLASMA TECHNIQUE

REFERENCE TO RELATED APPLICATIONS

This application claims priority to Provisional Patent Application U.S. Ser. No. 60/726,386, entitled "Production of Nano-Tungsten Powder by Plasma Technique" and filed Oct. 13, 2005, which is fully incorporated herein by reference.

GOVERNMENT RIGHTS

The U.S. Government has a paid-up license in this invention and the right in limited circumstances to require the patent owner to license others on reasonable terms as provided for by the terms of Contract Nos. DE-FG02-02ER83435, NNM05AA63C, and NNM04AA12C, awarded by the Department of Energy and National Aeronautics and Space Administration ("NASA").

BACKGROUND OF THE INVENTION

1. Field of the Invention

The present invention relates generally to ultra fine and nanosized powders, components and coatings and particularly to ultra fine and nanosized powders, components and coatings of refractory metals, for example tungsten, tantalum, molybdenum, rhenium, iridium, niobium, zirconium, and hafnium, and to related ceramics, for example tungsten carbide, molybdenum carbide, and other ferrous (Iron) and non-ferrous materials like aluminum, copper, silicon, vanadium, titanium and nickel and their oxides, nitrides and borides, and to a method of fabricating same.

2. Description of the Related Art

There is great interest in the formation and use of refractory metals, for example, tungsten, tantalum, molybdenum, rhenium, and hafnium, and related ceramics. Typical refractory metals and related ceramic materials are often commercially available in powders with particle sizes from 40-80 micron. These elements and compounds have the following corresponding symbols:

| | |
|---|---|
| Tungsten | W |
| Rhenium | Re |
| Molybdenum | Mo |
| Hafnium | Hf |
| Tantalum | Ta |
| Iridium | Ir |
| Niobium | Nb |
| Zirconium | Zr |
| Molybdenum Carbide | MoC |
| Tungsten Carbide | WC, $W_2C$ |

These materials are resistant to heat and have high melting temperatures. Some of these elements also have other desirable properties, including chemical stability, hardness, and ductility. These characteristics make these materials particularly useful in high temperature applications such as propulsion, X-ray targets and furnace systems. These materials, however, also have drawbacks. For example, the commercially available powders, with their relatively large grain size, often suffer from poor ductility and decohesion of the large grains at elevated temperatures, and may be brittle. Moreover, conventional tungsten materials, for example, often have to be forged to get adequate heat resistant properties. Forging tungsten into complex shapes is difficult, time consuming (often taking months), and has limited its application, particularly in propulsion applications. Forged tungsten can also suffer from unacceptably low fatigue values and crack resistance. Additionally, traditional fabrication techniques require that each part be machined from a large billet, which produces higher waste and significantly increases fabrication time. Also, the use of expensive machining processes such as electrical discharge machining (EDM) and diamond grinding are often required since coarse grained refractory materials are brittle at room temperature and very difficult to machine.

By reducing the grain size through innovative processing, the properties of the metals, including refractory metals, ceramic, and related materials can be greatly improved. The designation of nano materials (i.e., nanostructured or nanocrystalline) is usually used to describe materials with a particle diameter less than or equal to 100 nanometers. For the applications herein, materials and powders described as "ultra fine" generally contain a large portion nano sized materials (i.e., less than 100 nm), but may also contain some larger sized particles, for example up to 300 nm. Mechanical properties of ultra fine and nanostructured materials show remarkable improvement or deviation from the properties exhibited by coarser grained material. These unique properties are attributed to the significant increase in grain boundary area due to the small grain size. In terms of the mechanical properties, ultra fine and nanostructured metals have shown increases in hardness values, ultimate strength, and yield strengths. Also, ultra fine and nanostructured metals have shown a clear increase in hardness with decreasing grain size, following the well known Hall-Petch equation. Ultra fine and nanostructured ceramics have exhibited superplastic properties at low temperatures. This is significant because coarse-grained tungsten is brittle like ceramics materials at low temperatures. Also, further deviations from trends observed in conventional materials are observed in creep of ultra fine and nanostructured metals due to the decreased grain size. The reduced grain size also provides a significant increase in fatigue and crack resistance. Thus, there is growing demand for ultra fine and nanostructured materials. Development of these ultra fine and nanosized materials will allow the production of robust components with unique properties with reduced size and weight.

Current manufacturing processes for ultra fine and nanostructured powders of refractory metals and related ceramics are limited by expense, feedstock availability, low production volumes and products with inconsistent particle size, distribution, shape and impurities.

3. Summary of the Invention

Applicant has discovered that particular methods of thermal plasma processing of certain materials produce high purity metal, including refractory metal, ceramic, and other similar materials in the form of an ultra fine powder and nanopowder and components. Plasma processing offers a wide range of new and sophisticated operations for the production of these advanced materials. Plasma processing combines various processes, such as heating, melting, quenching, and consolidation of fine particles (metallic or ceramic) in a simplified process.

Advantages of thermal plasma processing include, high purity resulting materials, high enthalpy to enhance the reaction kinetics by several orders of magnitude, steep temperature gradient that enables rapid quenching and generation of fine particle size powder, components and coating, little or no hazardous waste by-products, and low cost with bulk production capacity (over 10 kg/hr for basic powder operation). The methods described herein also allow processing of inexpensive precursors (or feedstock). Moreover, for the direct deposit fabrication methods discussed herein, fabrication times for complex parts are reduced from months to days.

The products and methods discussed herein are applicable to many of the refractory metals, for example tungsten, tantalum, molybdenum, rhenium, iridium, niobium, zirconium, and hafnium, and to related ceramics, for example tungsten carbide, molybdenum carbide, and other ferrous (Iron) and non-ferrous materials like aluminum, copper, titanium, silicon, vanadium, and nickel and their oxides, nitrides and borides. For ease of reference, the detailed description will focus primarily on one refractory metal, tungsten, as a representative material, but such description is not a limitation on the applicability of the invention to other materials, including those identified above. One major benefit of nanocrystalline and ultra fine bulk tungsten is enhanced dynamic deformation behavior, specifically shear localization. Ultra fine and nano-structured tungsten, when used as a kinetic energy device, offers the opportunity for performance that exceeds depleted uranium.

Applications of ultra fine and nano materials disclosed herein include, but are not limited to, superior weapon systems for armor and anti-armor applications, high kinetic energy penetrators in tank ammunitions, armor plating, and scatter grenades, counterweights in tanks, non-eroding rocket nozzles and jet vanes and welding electrodes, crucibles, nuclear power, propulsion components (high-powered electrical, beamed energy, and nuclear), cartridges, X-ray targets and heat pipes.

These and other embodiments of the present invention will also become readily apparent to those skilled in the art from the following detailed description of the embodiments having reference to the attached figures, the invention not being limited to any particular embodiment(s) disclosed.

In one embodiment a method of producing ultra fine powders, including nanopowders, through thermal plasma processing is provided comprising the steps of (a) vaporizing a precursor having at least one metal in a plasma jet plume; and (b) inducing rapid solidification of said metal vapor in a substantially inert environment to obtain the ultra fine powder. This embodiment may further include the step of inducing chemical reaction of the metal vapor.

In another embodiment, an ultra fine powder with particle size between 25-300 nm is produced by vaporizing a precursor having at least one metal in a plasma jet plume of at least 3000 K and rapidly inducing solidification of said vapor.

In another embodiment, a process for depositing ultra fine particles onto a substrate through thermal plasma processing comprising the steps of (a) vaporizing a precursor having at least one metal in a plasma jet plume having a temperature of more than about 3000 K to obtain vaporized metal particles, (b) inducing solidification of the vaporized metal; and (c) depositing the metal directly onto the substrate.

In another embodiment, a nanopowder is provided comprising particles having a size of approximately about 50-300 nm, produced by vaporizing a precursor compound in a plasma jet plume having a temperature of at least about 3000 K to separate said precursor compound into two or more vaporized constituent elements and inducing rapid solidification of at least one of said vaporized constituent elements in an inert environment.

In another embodiment, a nanostructured material coating is formed by vaporizing a precursor having at least one metal in a plasma jet plume of at least about 3000 K, inducing solidification of the vaporized metal, and depositing the metal onto the component to be coated.

BRIEF DESCRIPTION OF THE DRAWINGS

The following drawings incorporated in and forming a part of the specification illustrate, and together with the detailed description, serve to explain the various aspects of the implementation(s) and/or embodiments of the invention and not of the invention itself.

DETAILED DESCRIPTION

The various embodiments of the present invention and their advantages are best understood by referring to FIGS. 1 through 13 of the drawings. The elements of the drawings are not necessarily to scale, emphasis instead being placed upon clearly illustrating the principles of the invention. Throughout the drawings, like numerals are used for like and corresponding parts of the various drawings.

The drawings represent and illustrate examples of the various embodiments of the invention, and not a limitation thereof. It will be apparent to those skilled in the art that various modifications and variations can be made in the present invention without departing from the scope and spirit of the invention as described herein. For instance, features illustrated or described as part of one embodiment can be included in another embodiment to yield a still further embodiment. Moreover, variations in selection of materials and/or characteristics may be practiced to satisfy particular desired user criteria. Thus, it is intended that the present invention covers such modifications as come within the scope of the present features and their equivalents.

Furthermore, reference in the specification to "an embodiment," "one embodiment," "various embodiments," or any variant thereof means that a particular feature or aspect of the invention described in conjunction with the particular embodiment is included in at least one embodiment of the present invention. Thus, the appearance of the phrases "in one embodiment," "in another embodiment," or variations thereof in various places throughout the specification are not necessarily all referring to its respective embodiment.

Figure 1:
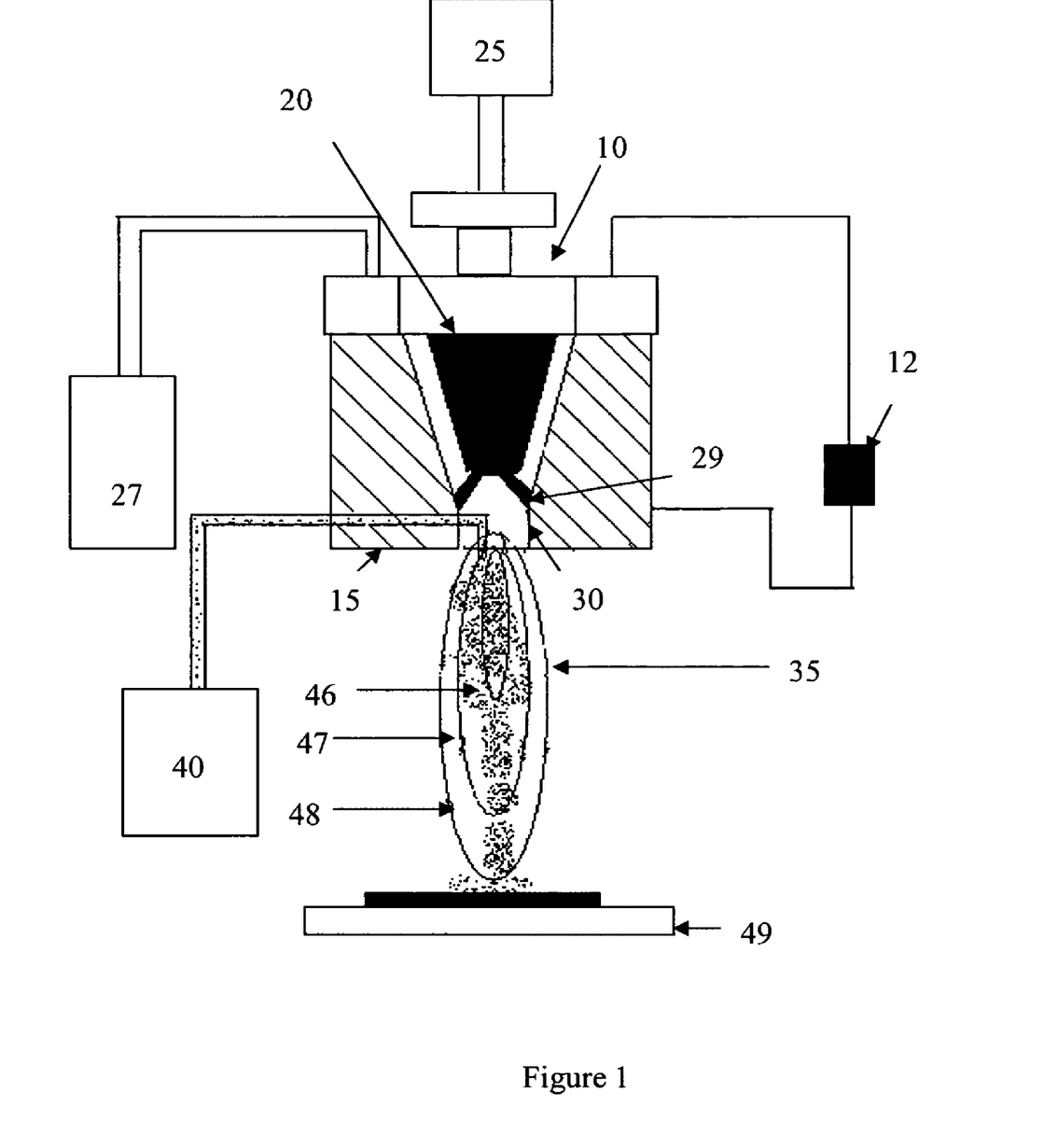
FIG. 1 is a depiction of one embodiment of the plasma spray process.

Depicted in FIG. 1 is an embodiment of the thermal plasma spray process. Plasma is often called a fourth state of matter, having ionized gas comprised of molecules, atoms, ions, electrons and photons. Once the ionized gases conduct electricity, the electrical energy is transferred to heat energy by the resistance offered by the gases. The temperature at which the plasma state is achieved lies between 3,000 and 13,000 K, and thus it is commonly called thermal plasma.

The plasma gun 10 is well-known in the industry, and is often configured to use power between 20 kW to 140 kW. The plasma gun 10 disclosed in FIG. 1 is simply one configuration of a plasma gun 10 that can be used. In this embodiment, the plasma gun 10 is powered by a power supply 12, and comprises an anode 15 and cathode 20, both of which are cooled by water from a water supply 25. Plasma gas (preferably argon, nitrogen, helium, or hydrogen) from a plasma gas source 27 flows around the cathode 20 and an anode 15 that are shaped as a constricting nozzle 30. The gas source 27 may provide any number of different gases to the system. The plasma gun 10 may use both a "primary" gas, for example argon, and a "secondary" gas, for example hydrogen, both provided by the gas source 27.

An electric arc 29 is initiated between the two electrodes and ionizes the plasma gas creating high-pressure gas plasma flame 35. The material to be processed, i.e., precursor, is dispensed, preferably through the plasma gun 10, into the plasma flame 35. Some powder precursors have particle size of less than about 60 μm, but many have larger particle size. The precursor is stored in a precursor storage container 40, and the precursor may be in liquid or solid (for example, powder) form. The system may also use a precursor feeder gas, or "carrier gas", provided by the plasma gas source 27 or another source, to assist in providing the precursor for processing. This is particularly helpful when the precursor is in powder form. The precursor deposited into the plasma flame 35 is heated, melted and vaporized and may include the step of inducing a chemical reaction in the vapor phase. The precursor used will depend on the end product desired, but examples of precursors include, but are not limited to tungsten, rhenium, molybdenum, tantalum, iridium, niobium, zirconium, iron, aluminum, copper, silicon, nickel, hafnium, vanadium, titanium, tungsten oxide, ammonium paratungstate, tungstic acid, rhenium oxide, perrhenic acid, ammonium pararhenate, molybdenum oxide, tantalum chloride, niobium chloride, tantalum oxide, iron oxide, nickel oxide, titanium oxide, niobium oxide, hafnium chloride, zirconium chloride, vanadium chloride, and chromium chloride.

FIG. 1 also depicts the different temperature "zones" relating to the plasma flame 35. The zones do not necessarily have clearly defined boundaries. The temperature differential is primarily a result of the distance from the plasma core, i.e., as you move farther away from the plasma jet flame 35, the temperature drops. The first zone, or vaporization zone 46, is closest to the plasma gun and is normally characterized by an approximate temperature of more than 5000 K (often 5000K to 10,000K). The maximum temperature is largely dependent on the power used and the configuration of the plasma gun 10, which could generate significantly less temperatures. In this zone, the precursor (after vaporizing as discussed below) is in the gaseous phase. The second zone, or reaction zone 47, is adjacent to the vaporization zone and is normally characterized by a temperature range of approximately 2000-5000 K. This zone has the strongest tendency for pure product formation, for example tungsten when a tungsten precursor is used. The third zone, or quench zone 48, is adjacent to the reaction zone, is the farthest from the plasma gun, and is normally characterized by a temperature of less than approximately 2000 K. This zone, for tungsten production, shows $WO_2(s)$, $H_2$ (g), and $H_2O$ (g) as the stable phases. Due to the temperature differential between the zones, the final product in the vapor phase gets quenched rapidly to solid phase yielding the ultra pure ultra fine and nanoproduct. This formation is favored where the quenching is rapid, the gaseous atmosphere remains strongly reducing, and no or minimal re-oxidation occurs.

Also depicted in FIG. 1 is use of an optional mandrel 49 on which to directly deposit the resulting nanoproduct. Additional reactant gas from a reactant gas source (not depicted), for example hydrogen gas, may be added in proximity to the plasma gun 10, and may facilitate the chemical reactions for processing of some precursors. The reactant gas, if used, may be introduced through the gun, or external to the gun, and preferably into the plasma flame below the gun. The introduction of the reactant gas into the plasma flame below the gun decreases the heat build up near the anode.

The precursor can take one of many forms, and depends on the desired end product. For example, if tungsten nanopowder is desired, liquid precursors of tungstic acid can be used. If tungsten-rhenium nanopowder is desired, liquid precursors of tungsten acid and perrhenic acid can be used. The powder precursor of tungsten oxide ($WO_3$), tungsten blue oxide (preferably −325 mesh), or ammonium paratungstate (preferably −270 mesh) or pure-W powder may also be used to obtain a tungsten nanopowder. Indeed, tungsten blue oxide is often designated as $WO_{2.9}$ and generally has the same chemical and thermodynamic properties as $WO_3$. If a powder precursor is used, it is often mixed with a carrier gas like argon to facilitate controlled release into the plasma flame 35.

Figure 2:
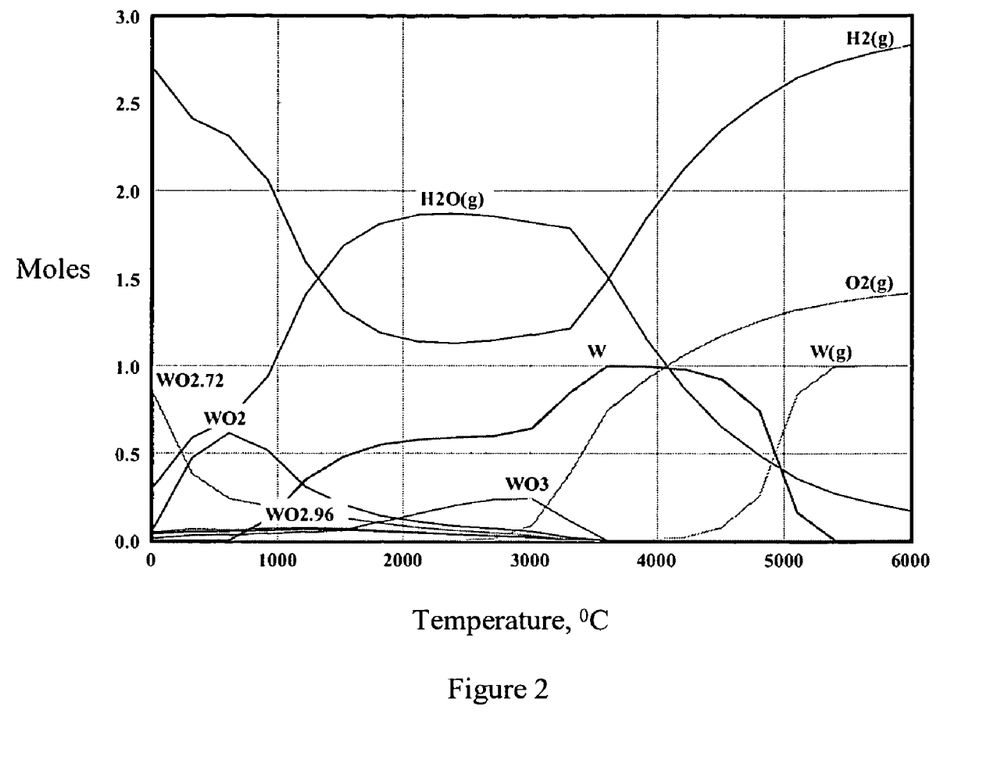
FIG. 2 is a Gibbs energy minimization plot for $WO_3$—$H_2$ system (molar ratio 1:3).

Depending on the precursor selected, additional materials, for example hydrogen gas as a "reactant gas" (or methane or nitrogen), may be added to the system to enhance the formation of the desired end product, for example tungsten. Thermodynamic analyses of the chemical reactions, based on the Gibbs energy minimization method, determine the ideal molar ratios for the reaction as a function of temperature. For example, depicted in FIG. 2 is the Gibbs energy minimization plot for the overall chemical reaction of $WO_3+3H_2$ (g)=W+ $3H_2O$ (g). The $H_2O$ is in the form of water vapor and is removed from the chamber through conventional means.

Based on the stoichiometry of the system, the feasibility of production of the desired products, in this example, tungsten, is determined from FIG. 2, or analogous calculations for other desired products, for example tantalum, molybdenum, rhenium, and hafnium, and related ceramics, for example tungsten carbide, molybdenum carbide, and other ferrous (Iron) and non-ferrous materials like aluminum, copper, silicon, titanium and nickel and their oxides, nitrides, and borides. Those of skill in the art, using fundamental chemistry and thermodynamic analyses of the chemical reactions, will be able to determine other processing parameters for producing nanosized particles for these products. The amounts of the various products that could be formed as a function of the reactants are analyzed in a relevant temperature range.

Figure 3:
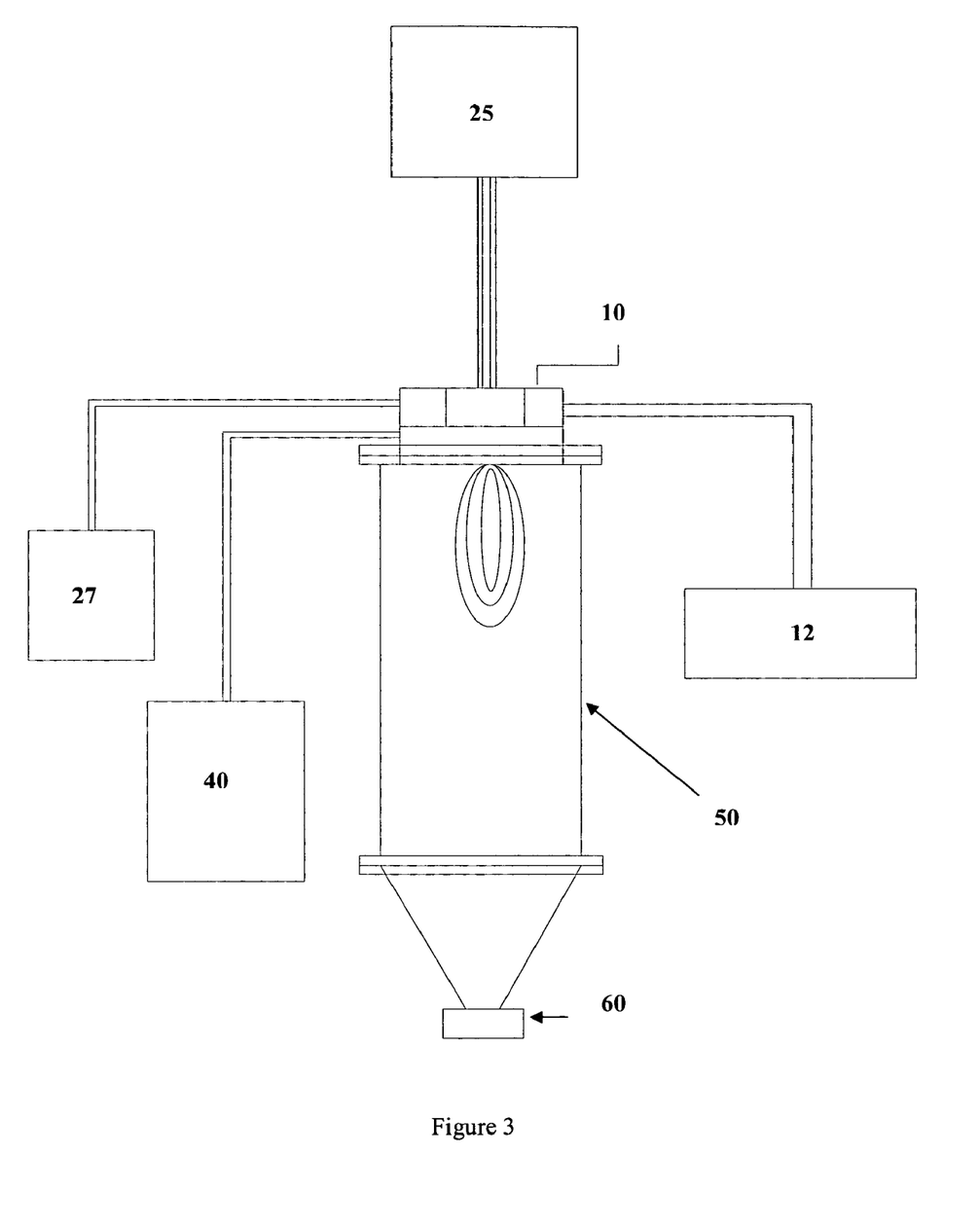
FIG. 3 is a depiction of one embodiment of the plasma chamber.

Depicted in FIG. 3 is an embodiment of the plasma reactor chamber 50 in which the processing may take place to produce ultra fine and nano powders. In this embodiment, the reactor chamber 50 is approximately 5 feet tall and 1.5 feet in diameter. The plasma gun 10 is preferably attached to the top part of the reactor chamber 50, but its location and configuration, as well as the size of the reactor chamber 50, are not limitations of the invention. Moreover, although only a single plasma gun 10 is depicted, multiple guns could be used to increase production rates. In this embodiment depicted in FIG. 3, the reactor chamber 50 is a closed vessel, and thus allows processing under inert atmosphere. This facilitates the resulting powder being substantially pure and oxygen free.

Also depicted in FIG. 3 is an optional transfer container 60 attached to the reactor chamber 50 to collect the ultra fine and nanopowders. The transfer container 60 is preferably connected to a vacuum pump so the transfer container 60 may be evacuated. After each production run, the valve is opened to collect the powders. Due to the pressure differential between the reactor chamber 50 and transfer container 60, powder is sucked into the transfer container 60, when the valve is opened. To prevent oxidation, the transfer container 60 is preferably opened in a glove box under inert conditions at or near room temperature. In this manner, the processed powder remains substantially pure and oxygen-free. Any conventional means of collecting the powder is contemplated under this invention, including collection and removal of the powder during a continuing, rather than a batch, process. The method of collection is not a limitation of the invention.

The amount of time needed to melt and vaporize the precursor (i.e., vaporization time) is dependant on the precursor and other reactants used. Determination of the approximate vaporization time is necessary to make sure proper processing occurs. As the precursor is injected into thermal plasma, it is heated, melted, and vaporized. This creates excellent conditions for physical and chemical reactions from the gas phase. Heat flux to the particle from the plasma is dependent on the temperature difference between gas and particle surface as well as on the heat transfer coefficient. An energy balance at the particle surface, which covers the energy transfer from the plasma to the particle, determines the temperature history of the particle, the energy required for heating the vapor from the particle surface temperature to the plasma temperature, and the latent heat for phase changes. Those of skill in the art, using fundamental chemistry and thermodynamic analyses of the chemical reactions, will be able to determine the operating parameters of the system, i.e., the temperature of the plasma flame required to vaporize the precursor in light of the length of time the precursor particles will reside in each temperature zone and the size of the precursor particles.

Particle Residence Time in the Vaporization and Reaction Zones

Particle "residence time" is the time the particle resides in the vaporization zone 46 and reaction zone 47 (together also referred to as the "hot zone") of the plasma reactor 50. In order to estimate the residence time of a particle in these zones, it is assumed that there is no particle slip velocity in the plasma gas and hence, the particle resident time equals to that of the plasma gas, and the plasma gas is an ideal gas. In this embodiment, the vaporization and reaction zones together is considered to be cone, with an approximate radius of about 2 inches and length of about 8 inches and its volume is $0.553 \times 10^{-3}$ m$^3$. The volumetric flow rate of plasma at 300 K is 260 Scfh, which is $2.05 \times 10^{-3}$ m$^3$/s. Thus, at an average temperature of 5000 K, the average particle residence time in the hot zone:

$$\text{Residence time} = 0.553 \times 10^{-3} / (2.05 \times 10^{-3} \times (5000/300)) = 16.19 \text{ msec}$$

Using fundamental chemistry and thermodynamic analyses, and basic assumptions regarding the size and shape of the hot zone, volumetric flow rate, and particle velocity, the following approximate vaporization times for tungsten oxide, as an example, may be calculated.

TABLE 1

Vaporization time for tungsten oxide

| Plasma Temp. Tg (K) | Vaporization time (ms) | | | | |
|---|---|---|---|---|---|
| | r = 20 μm | r = 30 μm | r = 40 μm | r = 50 μm | r = 60 μm |
| 3000 | 11.3 | 16.9 | 22.6 | 28.2 | 33.8 |
| 4000 | 3.84 | 5.76 | 7.68 | 9.6 | 11.5 |
| 5000 | 1.65 | 2.48 | 3.3 | 4.13 | 4.95 |
| 6000 | 0.818 | 1.23 | 1.64 | 2.04 | 2.45 |
| 7000 | 0.449 | 0.673 | 0.897 | 1.12 | 1.35 |
| 8000 | 0.265 | 0.39 | 0.531 | 0.664 | 0.796 |
| 9000 | 0.167 | 0.25 | 0.334 | 0.417 | 0.50 |

Based on above the calculation, the residence time in the vaporization and reaction zones will be long enough to completely vaporize $WO_3$ particles of size r<30 μm at a plasma temperature of 3000 k. The vaporization time for the tungsten oxide particle at an average temperature 5000 K for the size 60 μm is 4.95 ms (Table 1) where as the resident time of the tungsten oxide particle at that temperature is 16.19 ms. Hence a plasma flame of length of about 8 inches and radius of about 2 inches will have enough time to vaporize all tungsten oxide particles and has time for reaction to complete before reaching the quench zone. Using this technique, ultra pure tungsten powders of less than 20 nanometers can be produced at a rate of 10 kg/hr.

TABLE 2

List of Tests with TBO

| Test | Primary gas, psi | Secondary gas, psi | Feeder gas, psi/ | External Feed gas, psi | Power: kW |
|---|---|---|---|---|---|
| S05-18 | Ar, 70 psi | H2, 100 psi | Ar, 40 | H$_2$, 40 | 70.8 |
| S05-19 | Ar—He, 50 psi. | H2, 70 psi. | Ar, 40 | H$_2$, 40 | 48 |
| S05-20 | Ar—He, 70 psi. | H2, 90 psi. | Ar, 40 | H$_2$, 60 | 48 |
| S05-21 | Ar—He, 70 psi. | H2, 90 psi. | Ar, 40 | H$_2$, 60 | 37.2 |

Samples of Production of Nanotungsten Powder from TBO Precursor

Table 2 shows the list of tests carried out using tungsten blue oxide (TBO) precursor with several operation parameters, such as the plasma gun power and gas feed rates, to produce tungsten ultra fine and nanopowder in the plasma chamber. Generally, the greater the plasma gun power, the higher the temperature of the plasma flame. Other optional operational parameters that can be altered include feeding the additional reactant gas at an approximate angle of 30 degrees to the plasma flame (externally), which may help avoid heat accumulation in the plasma gun area.

Using the above parameters, processing in a closed plasma chamber 50 as depicted in FIG. 3, and hydrogen heat treatment (as discussed below) resulted in essentially pure (total carbon wt % of 0.0059), and essentially oxygen-free (total oxygen wt. % of 0.58) ultra fine and nanosized tungsten particles. Even without the optional hydrogen heat treatment, tungsten particles of approximate size range of 40-300 nm were obtained.

Samples of Production of Nanotungsten Powder from APT Precursor

Table 3 lists the tests carried out using ammonium paratungstate (−270 mesh) precursor and several operation parameters to produce nano-tungsten. The samples were done with fixed power (46.5 kW) and plasma gas pressures.

TABLE 3

List of tests with APT

| Tests | Primary gas, psi | Secondary gas, psi | Feeder gas, psi | External Feed gas, psi | Power: Amps & Volts |
|---|---|---|---|---|---|
| S-05-110 | Ar, 70, | H2, 70 | Ar, 40 | No feed | 46.56 |
| S05-112 | Ar, 70 | H2, 70 | Ar, 40 | $H_2$, 20 | 46.56 |
| S05-113 | Ar, 70 | H2, 70 | Ar, 40 | $H_2$, 75 | 46.56 |
| S05-114 Long run, 45 minutes | Ar, 70 | H2, 70 | Ar, 40 | $H_2$, 75 | 46.56 |

Using the above parameters, processing in a closed plasma chamber 50, as depicted in FIG. 3, and the option hydrogen heat treatment (discussed below), resulted in essentially pure (total carbon wt % of 0.0059), and essentially oxygen-free (total oxygen wt. % of 0.58) ultra fine and nanosized tungsten particles. Even without the optional hydrogen heat treatment, tungsten particles of approximate size range of 25-300 nm were obtained.

The powders collected from the chamber may optionally be subjected to hydrogen heat treatment to remove any oxygen pick-up during powder collection, or in the event the processing occurred in an open or non-inert environment. Hydrogen heat treatment is known in the art, and those of skill in the art will recognize the operational parameters that will work best depending on the nanopowder desired.

Although the actual parameters and methods of hydrogen heat treatment are not limitations of the invention, Applicant has found that hydrogen heat treatment of 700° C. for 10 hours to be beneficial. The hydrogen heat treatment can be carried out in a Thermolyne tube furnace or equivalent. Powders to be heat treated may be placed in a molybdenum boat and inserted into the tube furnace. In one embodiment, initially argon is allowed to flow for 5 minutes, and the igniters are kept on at the rear end to burn gases coming out from the furnace, and then hydrogen is introduced into the system when the furnace is ramping up. The cycle includes ramp-up, holding and cool down stages and the hydrogen is allowed to flow through all the stages, stopped at 200° C., and argon is allowed to flow through the furnace there after until the furnace temperature reaches ambient. Desired hydrogen flow rate is maintained throughout the process.

Figure 4:
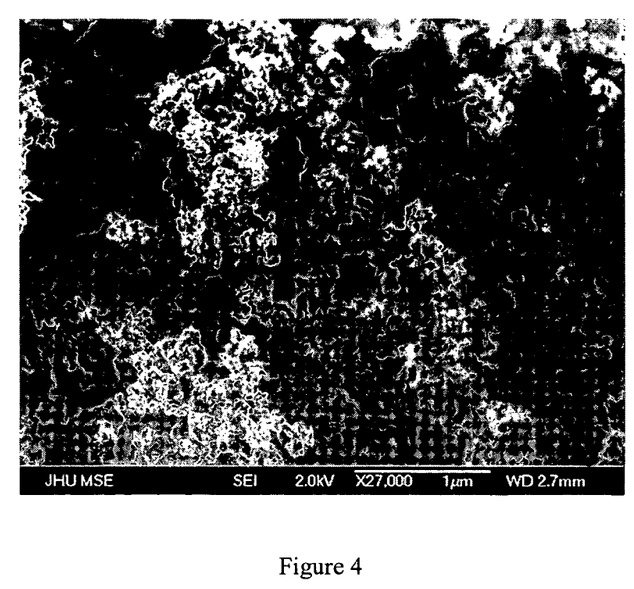
FIG. 4 is a scanning electron microscope picture of nano-tungsten powders made from tungsten oxide precursor with 1 hour hydrogen heat treatment.
Figure 5:
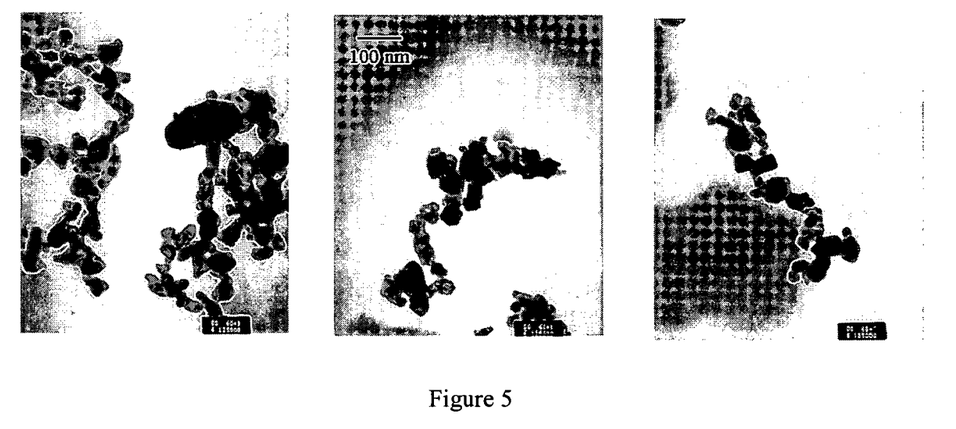
FIG. 5 is a transmission electron microscope picture of nano-tungsten powders made from tungsten oxide precursor with 1 hour hydrogen heat treatment.
Figure 6:
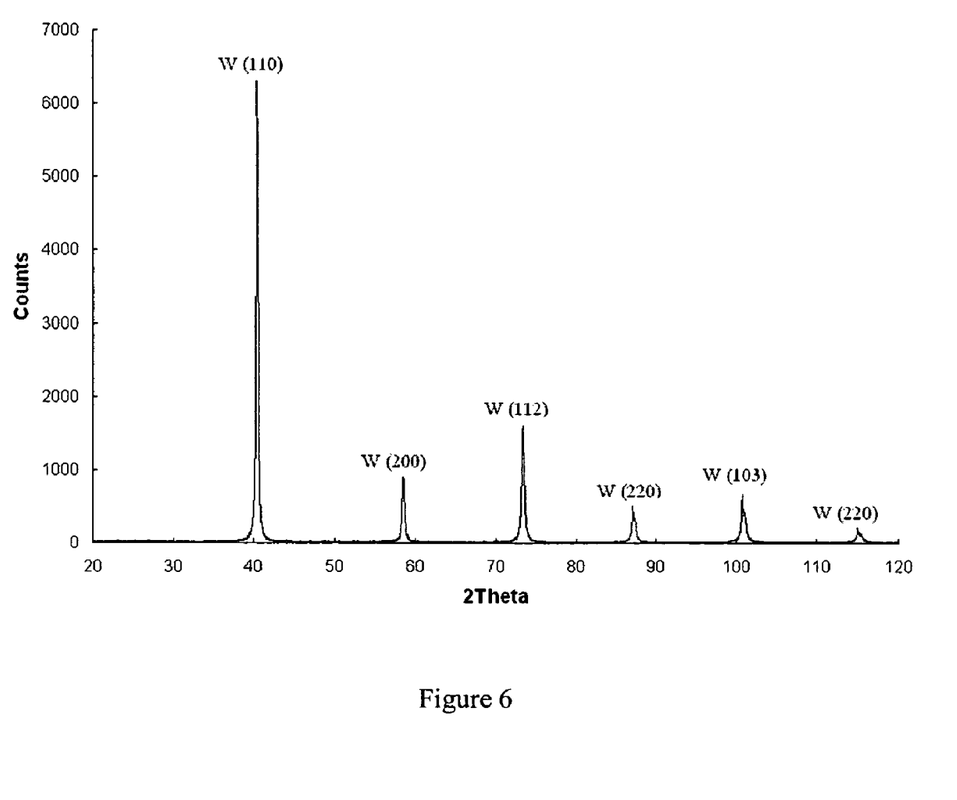
FIG. 6 is a X-ray diffraction pattern of nano-tungsten powders made from tungsten oxide precursor with 1 hour hydrogen heat treatment.
Figure 7:
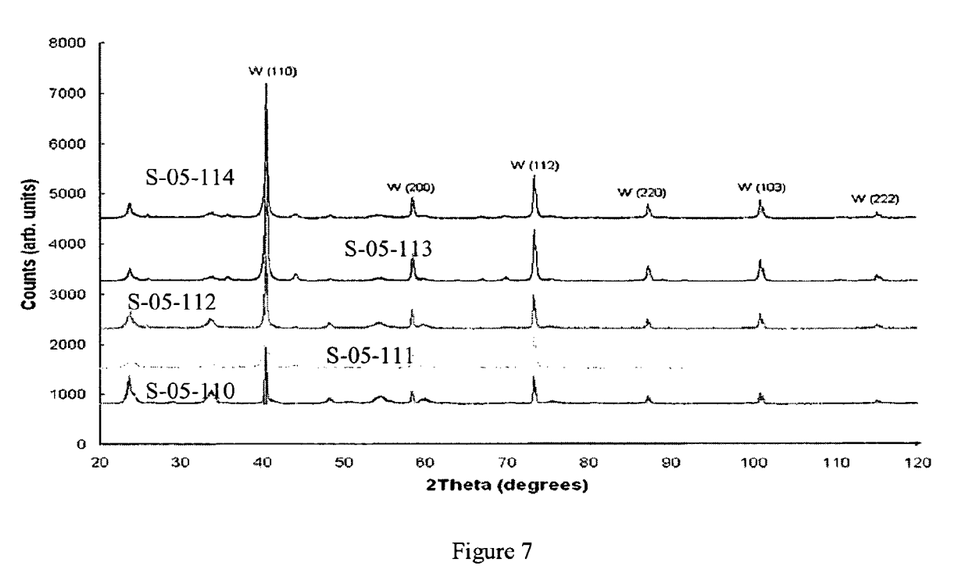
FIG. 7 is a X-ray diffraction pattern of nano-tungsten powders (as-plasma processed) made from APT.
Figure 8:
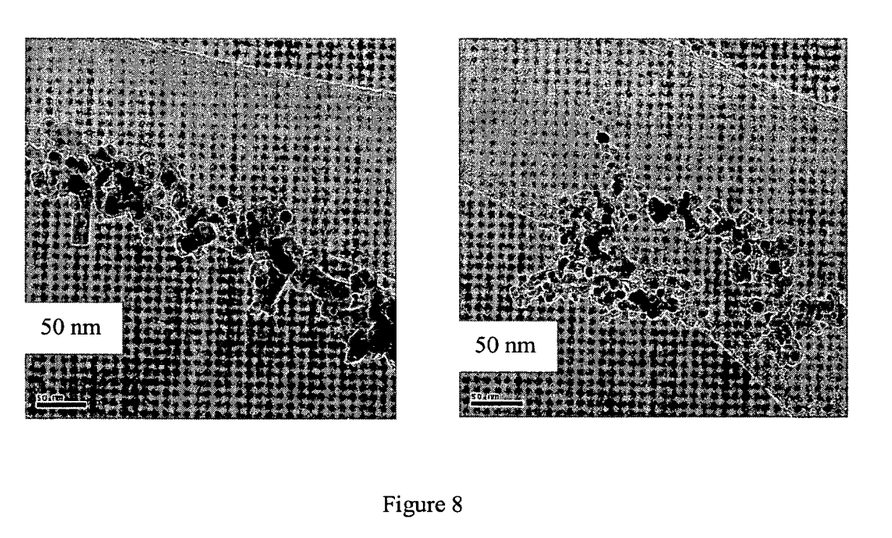
FIG. 8 is a transmission electron microscope picture of nano-tungsten powders made from APT after heat treatment.

FIGS. 4 and 5 show the Scanning Electron Microscope ("SEM") and Transmission Electron Microscope ("TEM") images, respectively, of nano-W powder generated from the TBO precursors. Nano tungsten powders have been successfully produced by this plasma technique with the size distribution of the powders of 40-300 nm. FIG. 6 shows the X-ray diffraction ("XRD") results of nano-W powder prepared from TBO using the foregoing method, including the hydrogen heat treatment. FIG. 7 shows the XRD results of nano-W powder prepared from APT using the foregoing method, not including the hydrogen heat treatment. FIG. 8 shows the TEM images of nano-W powder generated from the APT precursor. The particle sizes of nano-W from TBO and APT were almost identical. Particle agglomeration was also observed from these images. The XRD patterns of nano-W from TBO and APT after hydrogen heat treatment were essentially identical. Table 4 lists the oxygen and carbon analysis of the resulting nano-W powders. The powders are substantially oxygen free (less than 1% by weight) and essentially pure, i.e., little or no impurities.

TABLE 4

Oxygen and carbon analysis of nano-W

| Sample | Total Carbon (wt %) | Oxygen (wt %) |
|---|---|---|
| Nano-W | .0059 | .58 |

Samples of Production of Direct Coating Using Powder Precursor

The processed powders may also be directly deposited onto a surface rather than collected. For example, tungsten blue oxide powders as the starting materials may be used to spray nano tungsten onto a deposited surface, for example, graphite mandrels. The material may also be deposited simply as a coating on another surface. In one embodiment, the mandrel may be 1.5 inches in diameter and use a spray length (i.e., the distance the plasma gun moves horizontally in this case) of 3 inches. Other operating conditions, other surfaces to receive the deposited materials, as well as other precursors for refractory metals, for example tantalum, molybdenum, rhenium, iridium, niobium, zirconium, and hafnium, and to related ceramics, for example tungsten carbide, molybdenum carbide, and other ferrous (Iron) and non-ferrous materials like aluminum, silicon, copper, titanium and nickel and their oxides, nitrides and borides may also be utilized.

Figure 9:
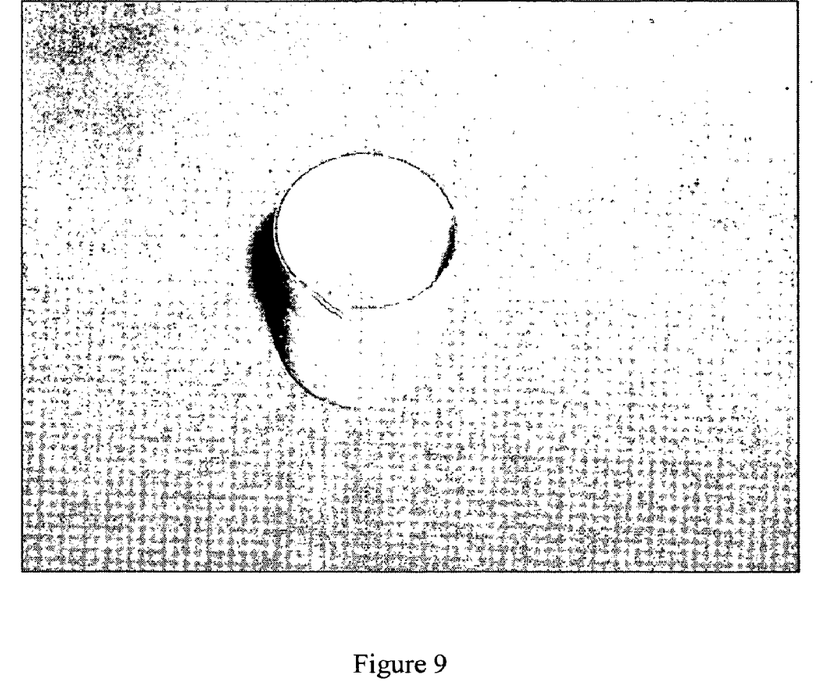
FIG. 9 is a spray formed tungsten cylinder photograph made from tungsten blue oxide precursor.

In one embodiment, the tungsten oxide powder is used as the precursor and hydrogen gas is used as the additional reactants gas. Argon is used as the primary plasma gas and hydrogen is used as the secondary plasma gas. The tungsten oxide powders are fed internally through the plasma gun. When the precursors are injected to the plasma flame the materials are heated, melted and vaporized, and the chemical reaction is induced in the vapor phase. The final product, which is in the vapor phase, gets quenched rapidly to solid phase to yield the ultra pure nano product. Table 5 lists the parameters used by Applicant for producing tungsten coating from tungsten oxide precursor. FIG. 9 shows the spray formed tungsten cylinder from TBO after the mandrel has been removed.

TABLE 5

Experiments to produce nano coating/component

| Run no: | Primary gas | Secondary gas | Feeder gas | Stand-off, inches | Vacuum | Mandrel | Power: Amps & Volts |
|---|---|---|---|---|---|---|---|
| V2-05-123 | Ar | H2 | Ar | 6.0 | 40-45 torr | Graphite, 1.5" diameter (Solid) | 1450 & 69.5 |

TABLE 5-continued

Experiments to produce nano coating/component

| Run no: | Primary gas | Secondary gas | Feeder gas | Stand-off, inches | Vacuum | Mandrel | Power: Amps & Volts |
|---|---|---|---|---|---|---|---|
| V2-05-124 | Ar | H2 | Ar | 5.0 | 40-45 torr | Graphite, 1.5" diameter hollow | 1450 & 69.5 |
| V2-05-125 | Ar | H2 | Ar | 5.0 | 40-45 torr | Graphite, 1.5" diameter (Solid) | 1500 & 70 |

Hydrogen Heat Treatment and Density Measurements

The as-sprayed samples may be subjected to hydrogen heat treatment to remove the entrapped oxygen and to make the material denser. Density was measured for both as-sprayed and hydrogen heat treated samples (i.e., sintered). Table 6 shows the values of as-sprayed densities. Table 7 shows the values of sintered densities.

TABLE 6

Measurements of as-sprayed densities by water immersion technique

| Run No: | Composition | As-sprayed Density (gms/c·c) | Theoretical Density (gms/c·c) | Density (%) |
|---|---|---|---|---|
| V2-05-123 | W | 18.65 | 19.3 | 96.6 |
| V2-05-124 | W | 17.57 | 19.3 | 91.03 |
| V2-05-125 | W | 18.12 | 19.3 | 93.88 |

TABLE 7

Measurements of sintered densities by water immersion technique

| Run No: | Composition | Sintered Density (gms/c·c) | Theoretical Density (gms/c·c) | Density (%) |
|---|---|---|---|---|
| V2-05-123 | W | 18.79 | 19.3 | 97.35 |
| V2-05-124 | W | 18.42 | 19.3 | 95.44 |
| V2-05-125 | W | 18.38 | 19.3 | 95.23 |

Figure 10:
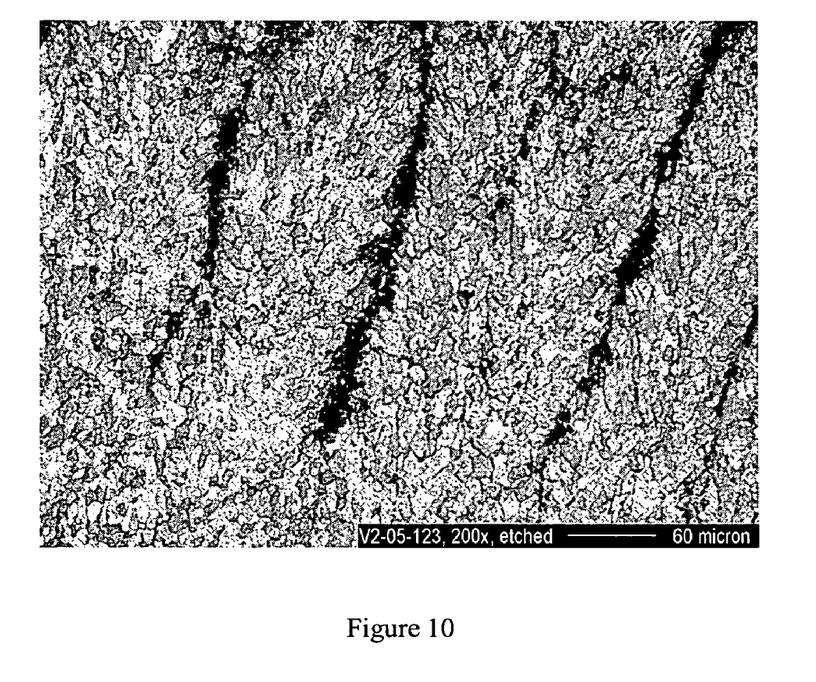
FIG. 10 is an optical micrograph of as-sprayed and etched sample of a direct tungsten coating using a tungsten oxide precursor.
Figure 11:
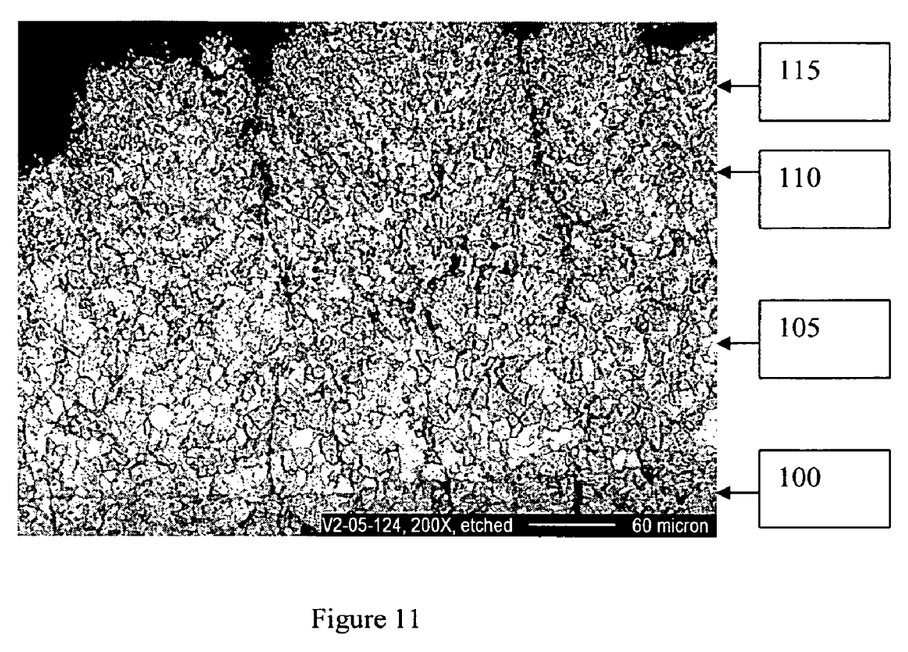
FIG. 11 is an optical micrograph of as-sprayed and etched sample of a direct tungsten coating using a tungsten oxide precursor.

Microstructure of W-spray Formed Structure (Before Heat Treatment) from Tungsten Oxide Microstructure of the tungsten direct deposits from tungsten oxide are shown in FIGS. 10 and 11. The samples (as-sprayed and sintered) from V2-05-123 to V2-05-125 were mounted in an epoxy and observed under SEM and Optical microscopes to analyze the grain structure.

FIGS. 10 and 11 show the optical micrograph of etched samples from run no: V2-05-123 and V2-05-124. These micrographs show the columnar grain structure and absence of splat structure in the spray formed product. Grains are micron size (<5 microns) as possible grain growth may take place during plasma spraying. Formation of W-spray formed product from tungsten oxide clearly depicts the occurrence of plasma chemical reaction (vapor phase reaction) and subsequent quenching of W-vapor on to the mandrel.

From FIG. 11, four different zones are observed showing different grain structures. Zone 1 is the tungsten carbide layer 100, and it was formed because of the carbon diffusion from the mandrel with the tungsten. Zone 2 105 is characterized by an equiaxed grain structure. Zone 3 110 shows a mixture of equiaxed and columnar grain structure and in the zone 4 115 a columnar grain structure is present. The plasma spraying temperature and the heat transfer of the mandrel plays a vital role in these different grain structure formations and will be appreciated by one of skill in the art.

Figure 12:
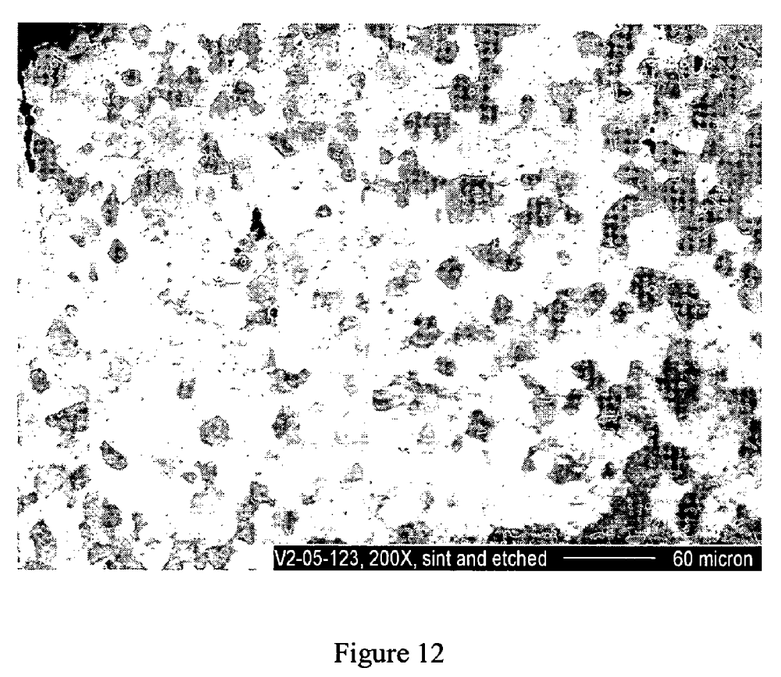
FIG. 12 is an optical micrograph of sintered (heat treated) sample of a direct tungsten coating using a tungsten oxide precursor.

Microstructure of W-spray Formed Structure (After Heat Treatment) from Tungsten Oxide FIG. 12 shows an optical micrograph of etched sintered sample from run V2-05-123. Note the sample has been etched to reveal the grain structure. A significant increase in grain size as compared to as-sprayed samples was observed, and a dense structure (97.5% dense, by water immersion technique).

Samples of Production Using Liquid Precursor

Figure 13:
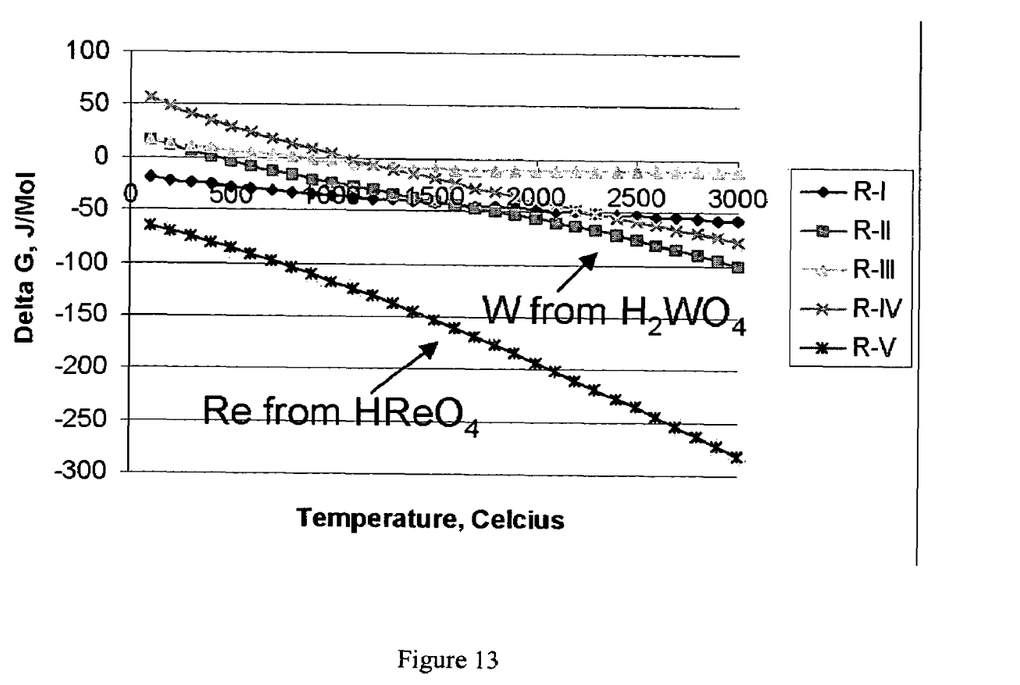
FIG. 13 is a Gibbs energy plot v. temperature for various tungsten and rhenium compounds.

In addition to the use of a powder precursor in a carrier gas, a liquid precursor (or feedstock) may also be used. In one embodiment, a tungsten-rhenium product may be desired. Thermodynamic analyses are done for the following reactions to determine the ideal molar ratio for the system and to select the best starting materials based upon the least Gibbs energy change. FIG. 13 show Gibbs energy plots versus temperature for various reactions. From these plots, it is clear the desired end product W—Re is more feasible from reactions II and V (i.e., more negative Gibbs energy). Based upon this method, the starting materials tungstic acid (for tungsten) and perrhenic acid (for tungsten-rhenium) were chosen.

R-I:

$ReO_2 + 2H_2 (g) = Re + 2H_2O (g)$

R-II:

$H_2WO_4 + 3H_2 (g) = W + 4H_2O (g)$

R-III:

$WO_3 + 3H_2 (g) = W + 3H_2O (g)$

R-IV:

$ReCl_5 = Re + 2.5 Cl_2 (g)$

R-V:

$HReO_4 + 3.5H_2 (g) = Re + 4H_2O (g)$

In this embodiment, a measured quantity of liquid feedstock is introduced through a dispenser (an atomizer in this embodiment) into the plasma stream just outside the plasma gun. When liquid precursors are used as the starting material, less heat is required to vaporize and induce chemical reactions and produce dense deposits. As the droplets enter the plasma plume the droplets are vaporized, and dissociated into gaseous species. The gaseous species react with the feeding gas, or additional reactant gas, to form the desired compound and nanosized microstructures by homogeneous nucleation and growth of the condensed species. Argon is often used as the atomizing gas. The processed "powder" is preferably deposited directly onto graphite or molybdenum mandrels. Thermal expansion mismatch causes separation of the deposit from the graphite mandrel upon cooling. The molybdenum mandrels can be removed using a chemical etching technique.

Advantages of plasma spraying of liquid precursors over conventional plasma spraying and chemical vapor deposition techniques include, better reduction in grain size will occur and will lead to the formation of nano-deposits, ability to control stoichiometric composition of the desired final product, improved purity due to vapor phase processing, and ability to co-deposit fine W, Re and transition metal carbide particles to produce an equiaxed grain structure and prevent grain growth.

Table 8 shows suitable parameters that can be used when processing the liquid precursors.

TABLE 8

Parameter Development Matrix

| Parameter | VPS Parameter 1 | VPS Parameter 2 | VPS Parameter 3 |
|---|---|---|---|
| Primary Arc Gas (psi), Ar | 90 | 90 | 100 |
| Secondary Arc Gas (psi), H2 | 160 | 150 | 180 |
| Carrier Gas (psi) | 60 | 60 | 60 |
| Main Arc Amps | 1300 | 1350 | 1600 |
| Main Arc Volts | 50.8 | 63.3 | 54.3 |
| Standoff (in) | 8.5 | 8.5 | 6.5 |

Optional heat treatments of the nanostructured W—Re deposits may further facilitate consolidation and microstructural refinement. For example, finished products may be sintered in $H_2$ at 1500 and 1700° C. for 4 hours and a vacuum bake out at 800° C. for 1 hour to remove the residual $H_2$. Sintered and as-sprayed samples may then be HIP at 1500° C.-1700° C. and 30 ksi for 2 hours. Those of skill in the art will appreciate and recognize that different operating parameters for the optional heat treatment may be used and modified based on the different applications discussed herein.

Other alternative embodiments include alloying of tungsten with rhenium ("Re") to provide a decrease in the ductile to brittle transition temperature with a simultaneous increase in elevated temperature strength. The change in properties is the result of the displacement of impurities at grain boundaries, which reduces the cohesive strength of grains. Also, the enrichment of grain boundaries with Re adds to the reduction of grain boundary embrittlement because impurities at the boundaries are bound in W—Re complexes. The result is increased ductility and strength. Although the addition of Re increases the high temperature ductility and strength, the full potential is not realized because the strength properties can deteriorate under conditions of tension due to grain boundary migration and intergrain slipping. However, one way to increase the high temperature strength is by fixing the grain and sub grain boundaries with fine particles of HfC. HfC was chosen because of its high thermo-dynamic stability and its comparatively low solubility in tungsten at high temperatures. Adding Re to W decreases the melting point and thermal conductivity. For this reason, small additions of 1-4% Re are desired. Tungsten alloy, Mo—Re, Nb—Zr, Ta-10W, and W—Re furnace cartridges may also be produced using this method.

When producing ultra fine and nanopowders of metal carbides, nitrides, oxides, and borides, the chemical reactions may be induced by utilizing reactant gases, for example methane or nitrogen, and other reactant agents, for example carbon, baron, and/or oxygen. Those of skill in the art will recognize and appreciate the different reactive gases and reactive agents that may be used depending on the end product desired.

The invention claimed is:

1. A method of producing ultra fine metal powder through thermal plasma processing comprising the steps of:
  a. Generating a plasma jet plume from a single plasma gun, said plasma jet plume having a hot zone with a temperature in excess of 2000 K;
  b. Dispensing a metallic compound precursor directly into said plasma jet plume, said metallic compound precursor comprising a metallic element constituting the intended metal powder and one or more elements to be removed from the metallic compound precursor;
  c. Vaporizing said metallic compound precursor in said plasma jet plume hot zone to generate a vapor of the metallic element and a vapor of the one or more elements to be removed from the metallic compound precursor;
  d. Adding a reactive gas to induce a chemical reaction between said reactive gas and the vapor of the one or more elements to be removed from the metallic compound precursor; and
  e. Inducing rapid solidification of said vapor of the metallic element to obtain ultra fine metal powder.

2. The method of claim 1 wherein the residence time of the metallic compound precursor in the plasma jet plume hot zone is less than 50 milliseconds.

3. The method of claim 1 wherein the metallic compound precursor is selected from the group consisting of tungsten oxide, tungsten blue oxide, ammonium paratungstate, tungstie acid, rhenium oxide, perrhenic acid, ammonium pararhenate, molybdenum oxide, tantalum chloride, niobium chloride, tantalum oxide, iron oxide, nickel oxide, titanium oxide, niobium oxide, hathium chloride, zirconium chloride, vanadium chloride, and chromium chloride.

4. The method of claim 3 wherein the ultra fine metal powder contains less than about 1 percent by total weight of oxygen.

5. The method of claim 3 further comprising the step of subjecting the ultra fine metal powder to hydrogen heat treatment.

6. The method of claim 3 wherein the metallic compound precursor is a liquid.

7. The method of claim 3 wherein the metallic compound precursor is a non-aerosol mixture consisting of a solid in a carrier gas.

8. The method of claim 1 wherein the ultra fine metal powder contains less than about 1 percent by total weight of oxygen.

9. The method of claim 1 further comprising the step of subjecting the ultra fine metal powder to hydrogen heat treatment.

10. The method of claim 1 wherein the metallic compound precursor is a liquid.

11. The method of claim 1 wherein the metallic compound precursor is a non-aerosol mixture consisting of a solid in a carrier gas.

12. The method of claim 1 wherein the size of the ultra fine powder is less than about 300 nm.

13. The method of claim 1 wherein the reactive gas is added external to the plasma gun.

* * * * *